INTEGRATED CIRCUIT USING OXIDE INSULATED TERMINAL PADS ON A SIC SUBSTRATE

Filed June 28, 1965

INVENTOR.
Thomas N. Tucker
BY
Howard W. Hermann
ATTORNEY

United States Patent Office 3,308,354
Patented Mar. 7, 1967

3,308,354

INTEGRATED CIRCUIT USING OXIDE INSULATED TERMINAL PADS ON A SiC SUBSTRATE

Thomas N. Tucker, Freeland, Mich., assignor to Dow Corning Corporation, Midland, Mich., a corporation of Michigan Filed June 28, 1965, Ser. No. 467,359
4 Claims. (Cl. 317—234)

The present invention relates to methods for attachment of leads to semiconductor electronic devices, and more particularly to attachment of leads to semi-conductor devices which are isolated by an insulating substrate having high thermal conductivity, and to circuits formed by the use of such methods.

In my copending U.S. patent application Serial No. 443,046, filed March 26, 1965, there is described a method for producing monolithic integrated semiconductor microelectronic circuits wherein the active devices of silicon, or the like, are imbedded as islands in an insulating substrate of highly pure silicon carbide. This technique provides an economical improved method of achieving electrical isolation between semiconductor devices in integrated circuits. It also provides for high heat dissipation from the active elements due to the high thermal conductivity of pure silicon carbide, thereby increasing the usefulness of semiconductor electronic devices in high power applications.

The advantageous high thermal conductivity of the silicon carbide has, however, created a problem in lead attachment for connection of the integrated circuit to external components or power sources. Such leads normally are run from the encapsulating header and are attached to a terminal pad on the integrated circuit. The area of the circuit is generally very small and requires that the leads be applied singly, rather than simultaneously. Using conventional thermal compression bonding techniques the heat from the area where a bond is being made is rapidly transmitted to other areas of the substrate by the excellent thermal conductivity of the silicon carbide and often causes previous bonds to be loosened. It is toward this problem that the present invention is directed.

It is a primary object of the present invention, therefore, to provide an improved method of facilitating the attachment of leads to semiconductor devices mounted on highly thermally conductive substrates.

In accordance with the present invention, this and other objects are accomplished, basically, by providing a thermal barrier between the terminal pads and the substrate. In the situation wherein the thermally conductive substrate is silicon carbide, and the active devices are formed from silicon, a layer of silicon oxide may conveniently be formed to obtain such isolation.

Other objects and attendant advantages of the invention will become obvious to those skilled in the art by a study of the following detailed description when read in conjunction with the following drawings wherein:

FIGS. 1 through 7 are cross-sectional views illustrating the steps in the process of manufacture of an integrated microelectronic circuit utilizing the present invention for attachment of leads.

Figure 1:
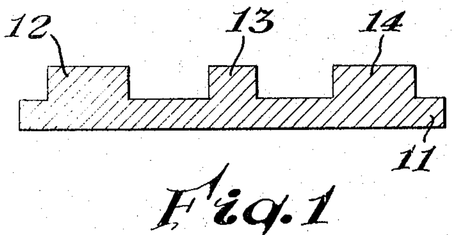

Referring now to the drawings wherein like reference numerals designate like or corresponding parts throughout the several figures, there is shown in FIG. 1 a slice or section 11 of monocrystalline semiconductor material such as silicon. One surface of the crystal 11 has been shaped into a pattern having a plurality of raised portions 12, 13 and 14, corresponding to the desired locations of active elements and terminal pads. The shaping may be done by any desired method such as photo-masking and etching. In accordance with the present invention; each of the terminal pads is generally formed with a larger cross-sectional area than the area of an active device.

Figure 2:
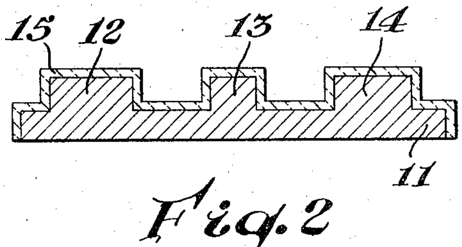
Figure 3:
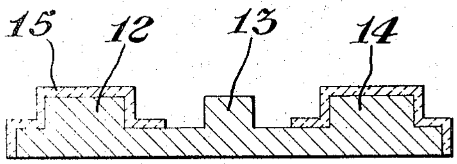

After the semiconductor crystal has been shaped, a layer 15 of oxidized material is formed over its surface, as shown in FIG. 2. This may be accomplished, for example, by thermal oxidation or steam oxidation of the crystal. In instances where the semiconductor crystal is silicon, for example, silicon oxide is easily formed in this manner. The thickness of the oxide layer is not critical as long as the layer is complete. A layer which is one micron in thickness has been found to be adequate. The oxide layer is then removed from the area 13 where active elements are to be formed, as shown in FIG. 3 to eliminate thermal barriers and provide for rapid heat dissipation in that region.

Figure 4:
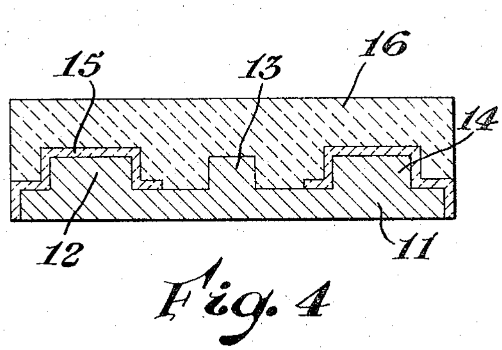
Figure 5:
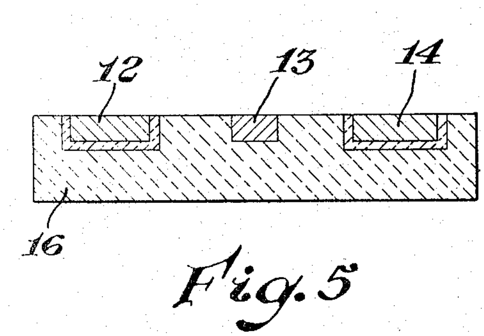

Silicon carbide 16 is then deposited over the entire surface of the crystal 11, as shown in FIG. 4. This is accomplished as described in my aforementioned copending application; for example, by decomposition of methyl-containing chlorosilanes. As shown in FIG. 5, the crystal is then removed to a level coplanar with the lowermost silicon carbide areas uring lapping and/or acid etching techniques as described in my aforementioned application. This step leaves a plurality of isolated islands of semiconductor crystal 12, 13 and 14 imbedded in the body 16 of silicon carbide. The areas 12 and 14 which will form terminal pads are isolated from the silicon carbide by a layer 15 of semiconductor oxide.

Figure 6:
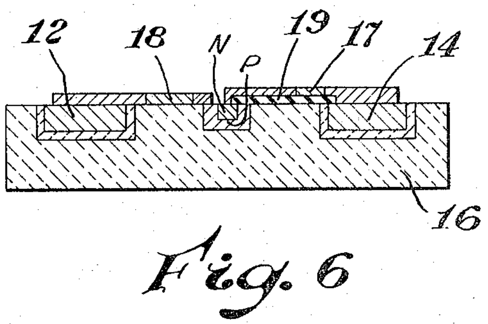
Figure 7:
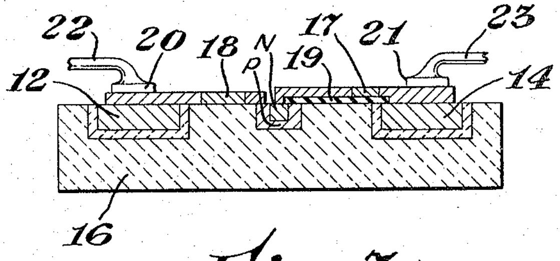

As shown in FIGS. 6 and 7, active semiconductor electronic elements, such as transistors, diodes, or similar type of devices, are formed by standard planar techniques to provide the necessary P–N junctions in the area 13. Passive elements 17, 18, which may be inductive, capacitive, or resistive, are formed by standard thin film techniques. Interconnections are provided, as needed, by conventional processing procedures between the active element, passive elements, and the terminal pads. Insulating layers 19 may also be provided as needed to prevent electrical interconnections, as is known in the art.

Due to the thermal isolation provided by the semiconductor crystal terminal pads and the oxide layer isolating them from the silicon carbide, standard thermal compression bonds may be made as shown at 20 and 21 (FIG. 7) to connect terminal leads 22, 23, to the terminal pads 12 and 14.

It is to be understood that the number of terminal pads and active elements used in any particular circuit will be a matter of design and that those shown on the drawings are merely illustrative of the principle involved. The technique desecribed provides an economical method of providing terminal connection to integrated semiconductor circuits having high power handling capability.

Various modifications and variations of the invention will become obvious to those skilled in the art from a consideration of the foregoing. It is to be understood, therefore, that within the scope of the appended claims the invention may be practiced, otherwise than as specifically described.

That which is claimed is:

1. A semiconductor electronic integrated circuit comprising:
   - a base of electrically insulative material having high thermal conductivity,
   - at least one active semiconductor electronic element imbedded in said base,
   - a plurality of terminal pads on said base, said terminal pads being spaced from said active semiconductor element and having affixed thereto electrical interconnections with said active element, and
   - a barrier layer of material having low thermal conductivity interposed between said terminal pads and said base to thermally isolate said terminal pads from said base.

2. A semiconductor electronic integrated circuit as defined in claim 2 wherein said active semiconductor electronic circuit is in direct physical contact with said base.

3. A circuit as defined in claim 2 wherein said base material is silicon carbide.

4. A circuit as defined in claim 3 wherein said semiconductor element and said pads are formed of monocrystalline silicone and said barrier layer is silicon oxide.

References Cited by the Examiner

UNITED STATES PATENTS 3,171,761 4/1965 Marinace ___________ 148—175

OTHER REFERENCES

Electronics Review, vol. 37, No. 17, June 1, 1964, p. 23.

JOHN W. HUCKERT, *Primary Examiner.*

M. EDLOW, *Assistant Examiner.*